(12) United States Patent
Tseng et al.

(10) Patent No.: US 10,778,231 B2
(45) Date of Patent: Sep. 15, 2020

(54) CLOCK DIVIDING FREQUENCY CIRCUIT, CONTROL CIRCUIT AND POWER MANAGEMENT INTEGRATED CIRCUIT

(71) Applicant: Silergy Semiconductor Technology (Hangzhou) LTD, Hangzhou, ZheJiang Province (CN)

(72) Inventors: Jaime Tseng, Hangzhou (CN); Xiaoping Chen, Hangzhou (CN); Hongfeng Fan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/828,610

(22) Filed: Dec. 1, 2017

(65) Prior Publication Data

US 2018/0159539 A1    Jun. 7, 2018

(30) Foreign Application Priority Data

Dec. 6, 2016  (CN) .......................... 2016 1 1109739

(51) Int. Cl.
| | | |
|---|---|---|
| *H02M 3/156* | (2006.01) | |
| *H03K 21/08* | (2006.01) | |
| *H03K 3/037* | (2006.01) | |
| *H03K 4/08* | (2006.01) | |

(52) U.S. Cl.
CPC ............ *H03K 21/08* (2013.01); *H02M 3/156* (2013.01); *H03K 3/037* (2013.01); *H03K 4/08* (2013.01)

(58) Field of Classification Search
CPC ........ H03K 21/08; H03K 21/10; H03K 21/12; H03K 21/14; H02M 3/156; H02M 3/1563; H02M 3/157–1588
USPC ......................................................... 327/115
See application file for complete search history.

(56) References Cited

U.S. PATENT DOCUMENTS

| | | | | |
|---|---|---|---|---|
| 7,535,210 | B2 * | 5/2009 | Wang | H02M 3/156 323/282 |
| 8,120,330 | B1 * | 2/2012 | Tseng | H02J 7/0077 320/166 |
| 9,306,574 | B1 | 4/2016 | Zhao et al. | |
| 9,391,511 | B2 | 7/2016 | Yu et al. | |
| 9,678,556 | B2 | 6/2017 | Pal et al. | |
| 2009/0066408 | A1 * | 3/2009 | Fujiwara | H02M 3/07 327/536 |
| 2012/0043949 | A1 | 2/2012 | Nakamura | |
| 2012/0235689 | A1 * | 9/2012 | Jau | A61B 5/0205 324/629 |
| 2013/0241511 | A1 * | 9/2013 | Xi | H02M 3/158 323/283 |
| 2015/0207404 | A1 * | 7/2015 | Philip | H02M 3/158 455/73 |

(Continued)

*Primary Examiner* — Patrick C Chen
(74) *Attorney, Agent, or Firm* — Michael C. Stephens, Jr.

(57) ABSTRACT

A clock dividing frequency circuit can include: a controlled current source configured to generate a driving current that varies with a dividing frequency control signal; a ramp signal generating circuit configured to generate a ramp signal having a slope that varies according to the driving current, where the ramp signal is reset according to pulses of a dividing frequency clock signal; and a dividing frequency pulse generating circuit configured to generate the dividing frequency clock signal by a dividing frequency operation according to the ramp signal and a system clock signal.

20 Claims, 7 Drawing Sheets

(56) References Cited

U.S. PATENT DOCUMENTS

2015/0357999 A1\* 12/2015 Soe .......................... G05F 3/16
  343/850
2016/0066280 A1  3/2016 Heo et al.
2018/0262018 A1\* 9/2018 Satoh ..................... H02J 7/007

\* cited by examiner

US 10,778,231 B2

CLOCK DIVIDING FREQUENCY CIRCUIT, CONTROL CIRCUIT AND POWER MANAGEMENT INTEGRATED CIRCUIT

RELATED APPLICATIONS

This application claims the benefit of Chinese Patent Application No. 201611109739.1, filed on Dec. 6, 2016, which is incorporated herein by reference in its entirety.

FIELD OF THE INVENTION

The present invention generally relates to the field of power electronics, and more particularly to clock dividing frequency circuitry, control circuitry, and associated power management circuitry.

BACKGROUND

Clock dividing frequency is an operation that reduces the constant system clock frequency by an integral multiple. In a large-scale circuit with a plurality of different modules (e.g., a power management IC having a plurality of switching regulators), all channels in the integrated circuit may share the same system clock such that each channel is synchronized, in order to optimize noise performance and save chip space. Due to characteristics of each module/circuit, the local clock frequency may be less than the system clock frequency in order to provide protection. In an example switching converter with a buck topology, the local clock frequency may be reduced in order to protect the power stage circuit. Although the system clock signal can be digitally divided, it can be difficult to change the clock frequency smoothly and proportionally according to the voltage difference in such cases.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
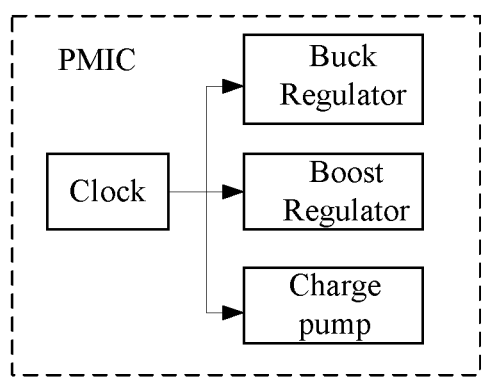
FIG. 1 is a block diagram of an example power management integrated circuit.

Referring now to FIG. 1, shown is a block diagram of an example power management integrated circuit. In this particular example, the power management integrated circuit can manage and control a plurality of different types of power converters or power modules (e.g., a buck power converter, a boost converter, a charge pump, etc.). A plurality of different types of power converters can share a system clock circuit/module, and may generate pulse-width modulation (PWM) control signals based on the system clock.

Figure 2:
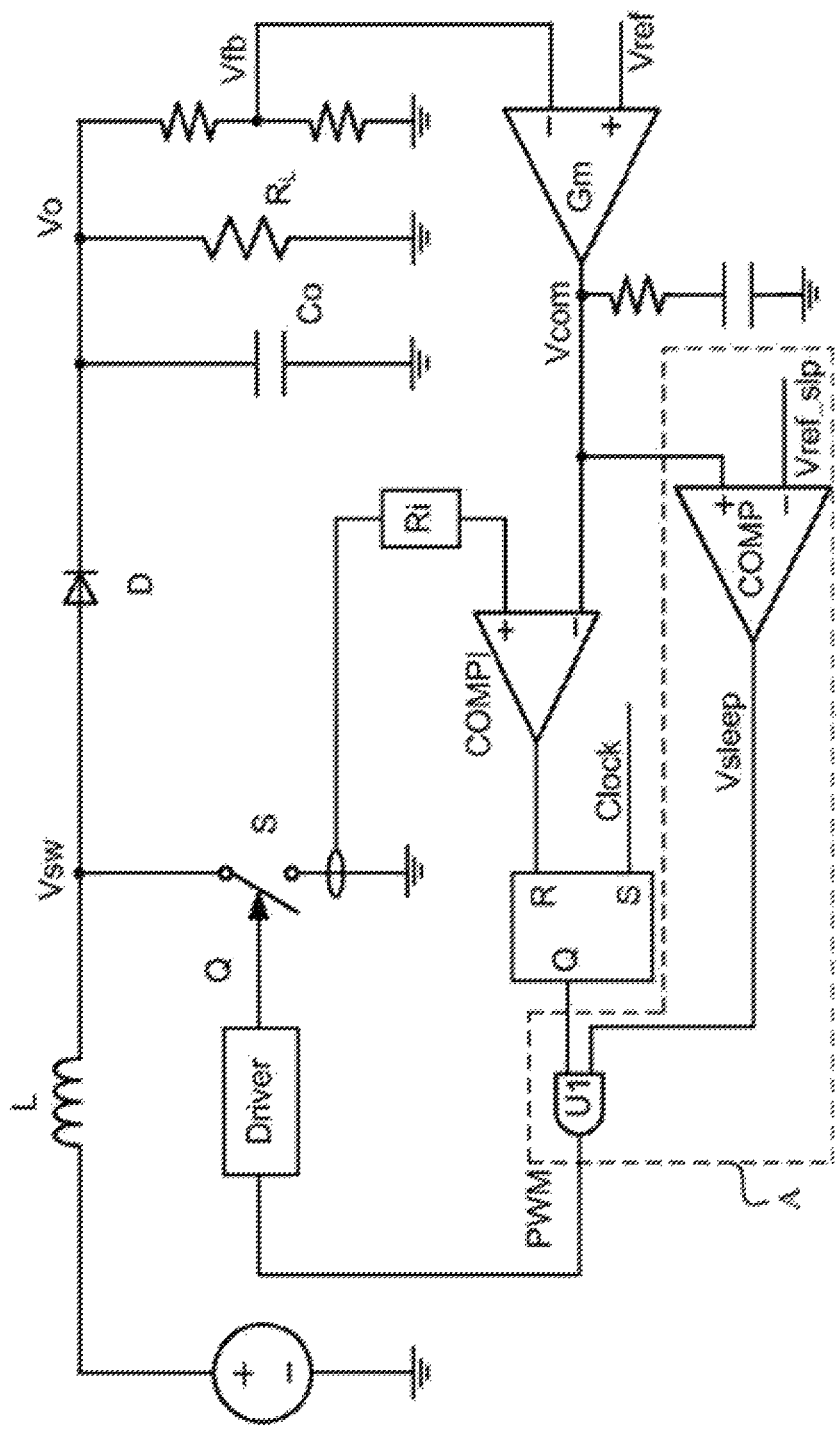
FIG. 2 is a schematic block diagram of an example switching converter.

Referring now to FIG. 2, shown is a schematic block diagram of an example switching converter. In this example boost switching converter, the power stage circuit can include inductance L, power switch S, rectifier diode D, and filter capacitor Co having output voltage Vo that drives load $R_L$. The control circuit can generate switching control signal Q to control power switch S to (e.g., to turn on/off). The control circuit can include a dividing voltage network that divides output voltage Vo and provides back feedback voltage Vfb to the compensation circuit. The compensation circuit can include transconductance amplifier Gm, a compensation network including a capacitor and a resistor coupled in series. The current sampling circuit can sample the current flowing through power switch S, which can be converted by the conversion network and received by the one input of comparator COMPI. Another input of comparator COMPI can receive compensation signal Vcom from the compensation circuit. Thus, the compensation circuit and comparator COMPI can form a feedback loop circuit of the output voltage and the inductor current, to control the power stage circuit to generate a constant voltage and a current based on the feedback loop circuit.

The RS flip-flop can receive the system clock signal at its set terminal S. Comparator COMP in the control circuit can compare comparison compensation signal Vcom and predetermined sleep reference signal Vref_slp at its input terminals, and may generate enable sleep signal Vsleep. The output terminal of the RS flip-flop and the output terminal of the comparator COMP can respectively connect to the two input terminals of logic gate U1. Pulse-width modulation signal PWM generated by logic gate U1 can control power switch S to turn on or off through driving circuit Driver. This example circuit includes logic gate U1 and comparator COMP as sleep trigger circuit A. When comparator COMP determines that the system is in a light load state (e.g., when compensation signal Vcom is lower than reference signal Vref_slp), pulse-width modulation signal PWM may be independent of the output state of the RS flip-flop.

Figure 3:
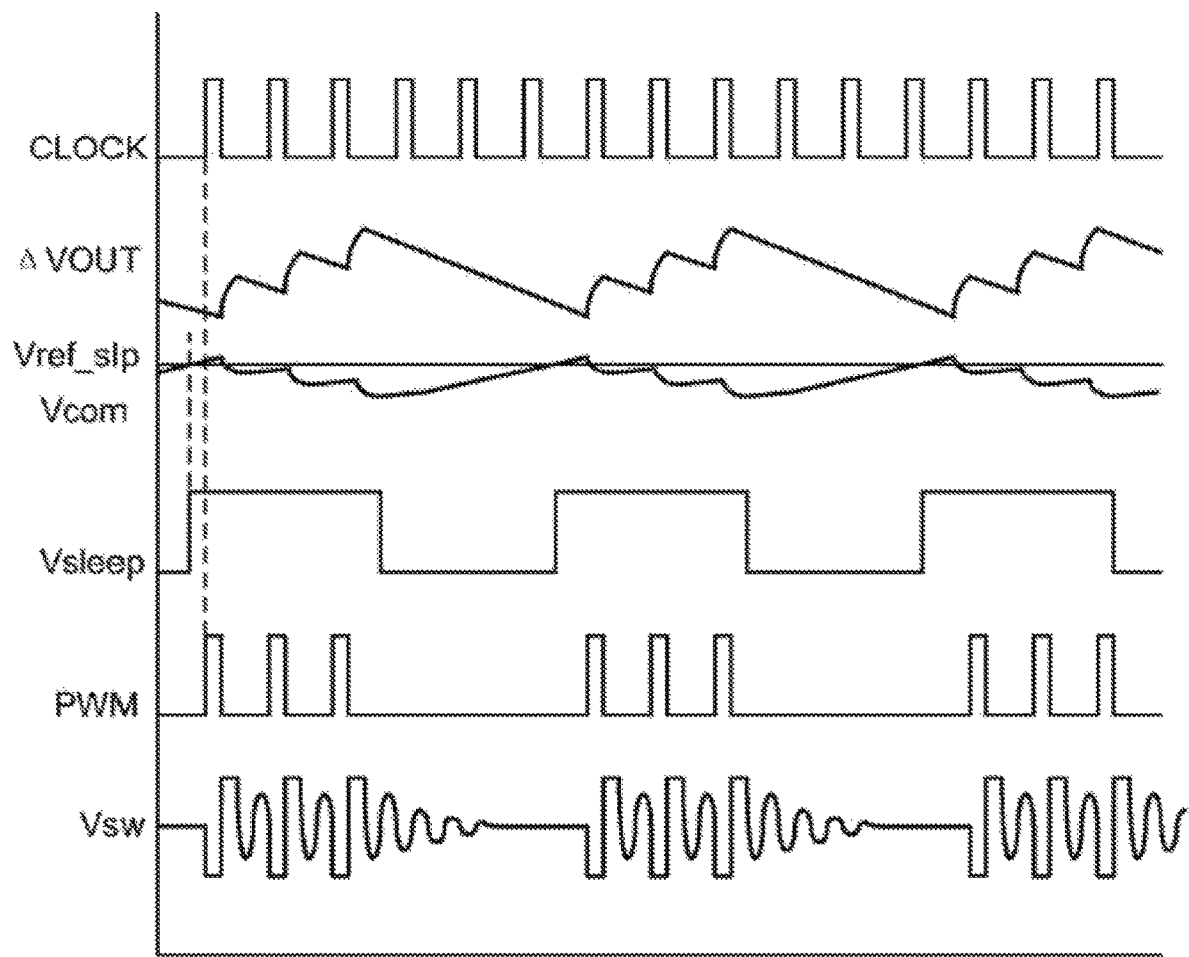
FIG. 3 is a waveform diagram showing example operation of the circuit of FIG. 2.

Referring now to FIG. 3, shown is a waveform diagram of example operation of the circuit of FIG. 2. For example, Vsw is the voltage of the power switch at the non-ground terminal in the power stage circuit, and ΔVOUT is the fluctuation of the output voltage. When the load of the power stage circuit is relatively small (e.g., a light load), output voltage Vo can rise, such that compensation signal Vcom is gradually lowered. Sleep enable signal Vsleep can be activated (e.g., go low) when compensation signal Vcom falls below sleep reference signal Vref_slp, such that logic gate U1 remains low at its output terminal. Power switch S can remain off, and the power stage circuit may enter the sleep state. During the sleep state, the output capacitor can be discharged by the load, and output voltage Vo may gradually be minimized to make compensation signal Vcom slowly rise. When compensation signal Vcom rises above sleep reference signal Vref_slp, enable sleep signal Vsleep can be deactivated (e.g., go high), such that the output of logic gate U1 follows output Q of the RS flip-flop. As a result, power switch S can periodically turn on and off, output voltage Vo may again begin to rise, and the power stage circuit can exit the sleep state. In this example, due to the delay of comparator COMP and the limitation of the loop bandwidth, the circuit may enter the sleep state after a few pulses. This can lead to larger output voltage ripple, and may deteriorate the adjustment rate of the output voltage load.

In one embodiment, a clock dividing frequency circuit can include: (i) a controlled current source configured to generate a driving current that varies with a dividing frequency control signal; (ii) a ramp signal generating circuit configured to generate a ramp signal having a slope that varies according to the driving current, where the ramp signal is reset according to pulses of a dividing frequency clock signal; and (iii) a dividing frequency pulse generating circuit configured to generate the dividing frequency clock signal by a dividing frequency operation according to the ramp signal and a system clock signal.

Figure 4:
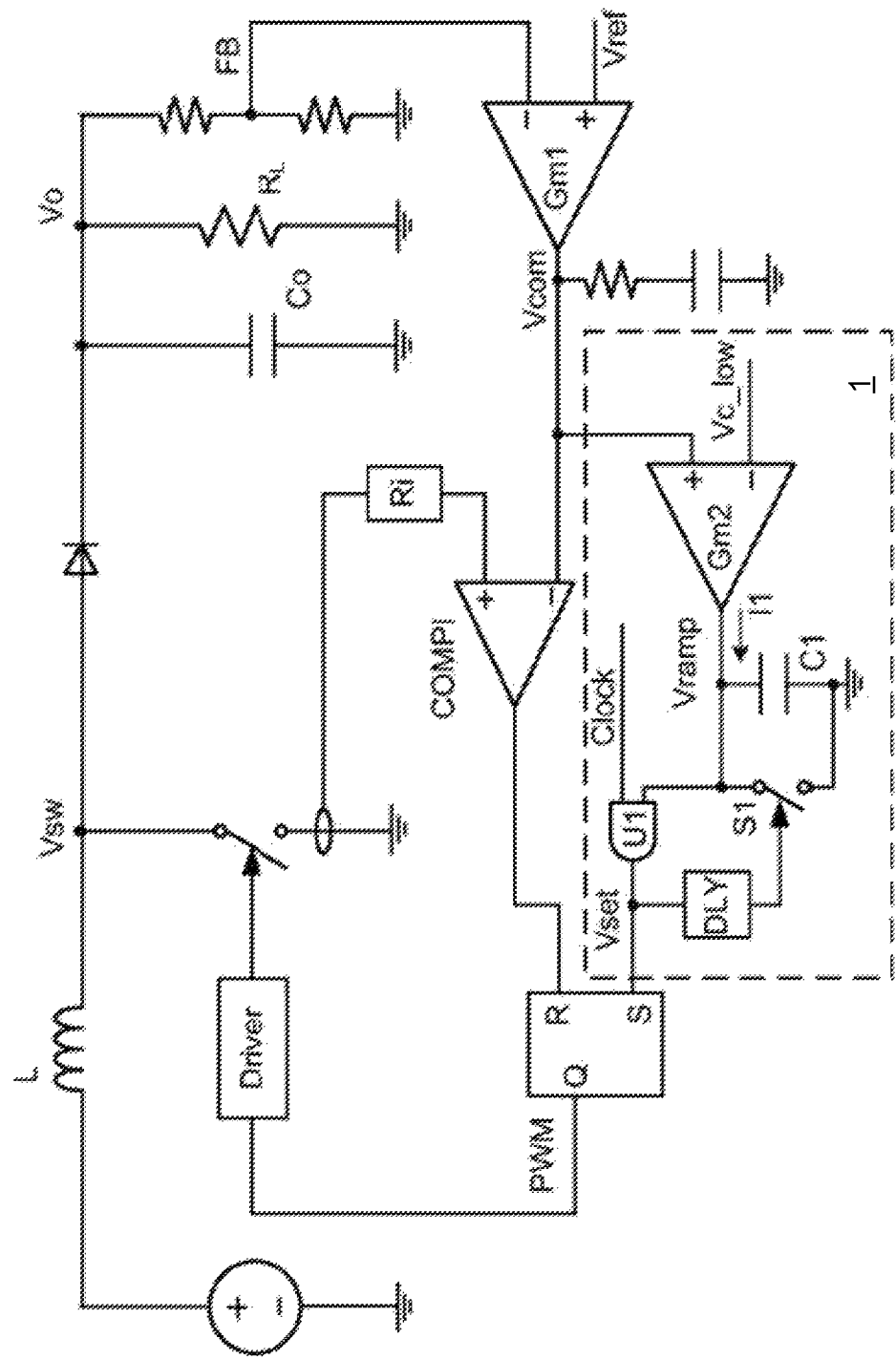
FIG. 4 is a schematic block diagram of an example switching converter, in accordance with embodiments of the present invention.

Referring now to FIG. 4, shown is a schematic block diagram of an example switching converter, in accordance with embodiments of the present invention. In this particular example, the set terminal S of the RS flip-flop in the control circuit may not directly receive the system clock signal, but rather may receive a localized clock signal that varies with compensation signal Vcom by a dividing frequency operation. The frequency of the pulse-width modulation (PWM) signal can vary with the decrease of compensation signal Vcom. Thereby, the operating frequency of the power stage circuit may be decreased, in order to decrease the output voltage ripple, and to improve response of the load regulation rate during the light load state.

In this example boost type switching converter, the structure of the power stage circuit, the voltage control loop circuit, and the current control loop circuit of the control circuit can be the same or similar to those shown in FIG. 2. In this particular example of FIG. 4, a clock dividing frequency circuit (e.g., 1) can be utilized to divide the system clock signal (e.g., Clock) according to compensation signal Vcom that is generated by the compensation circuit. Clock dividing frequency circuit 1 can include a controlled current source, a ramp signal generating circuit, and a dividing frequency pulse generating circuit. For example, the controlled current source can generate driving current I1 that varies with the dividing frequency control signal (e.g., compensation signal Vcom).

In particular embodiments, the controlled current source can be configured as transconductance amplifier Gm2, which can receive signal Vcom at the non-inverting terminal, and reference voltage Vc_low at the inverting terminal. Transconductance amplifier Gm2 can adjust the value of driving current I1 according to the variation of compensation signal Vcom. The ramp signal generation circuit can include capacitor C1 and switch S1 coupled in parallel. For example, capacitor C1 and switch S1 can be coupled in parallel between the output terminal of transconductance amplifier Gm2 and ground. The control terminal of switch S1 can be controlled to be turned on or off according to the dividing frequency clock signal. The dividing frequency pulse generating circuit can generate dividing frequency clock signal Vset by dividing frequency operation according to ramp signal Vramp and system clock signal Clock.

In an alternative example, the control terminal of switch S1 can be controlled by the pulses of the local clock signal delayed by delay circuit DLY, in order to improve the overall circuit synchronization performance. For example, the dividing frequency pulse generating circuit can include "AND" logic circuit U1, which may be a single AND-gate, or an AND non-logic gate and a non-logic gate in series. The pulse of dividing frequency clock signal Vset can be provided to set terminal S of the RS flip-flop. During the time interval when switch S1 is off, capacitor C1 can be charged by driving current I1 generated by transconductance amplifier Gm2. The value of driving current I1 may be proportional to the rising slope of the voltage across capacitor C1 (e.g., ramp signal Vramp), and the larger that driving current I1 is, the faster that ramp signal Vramp rises. During the time interval when switch S1 is on, capacitor C1 can be discharged, and ramp signal Vramp may rapidly drop to the ground level.

Figure 5:
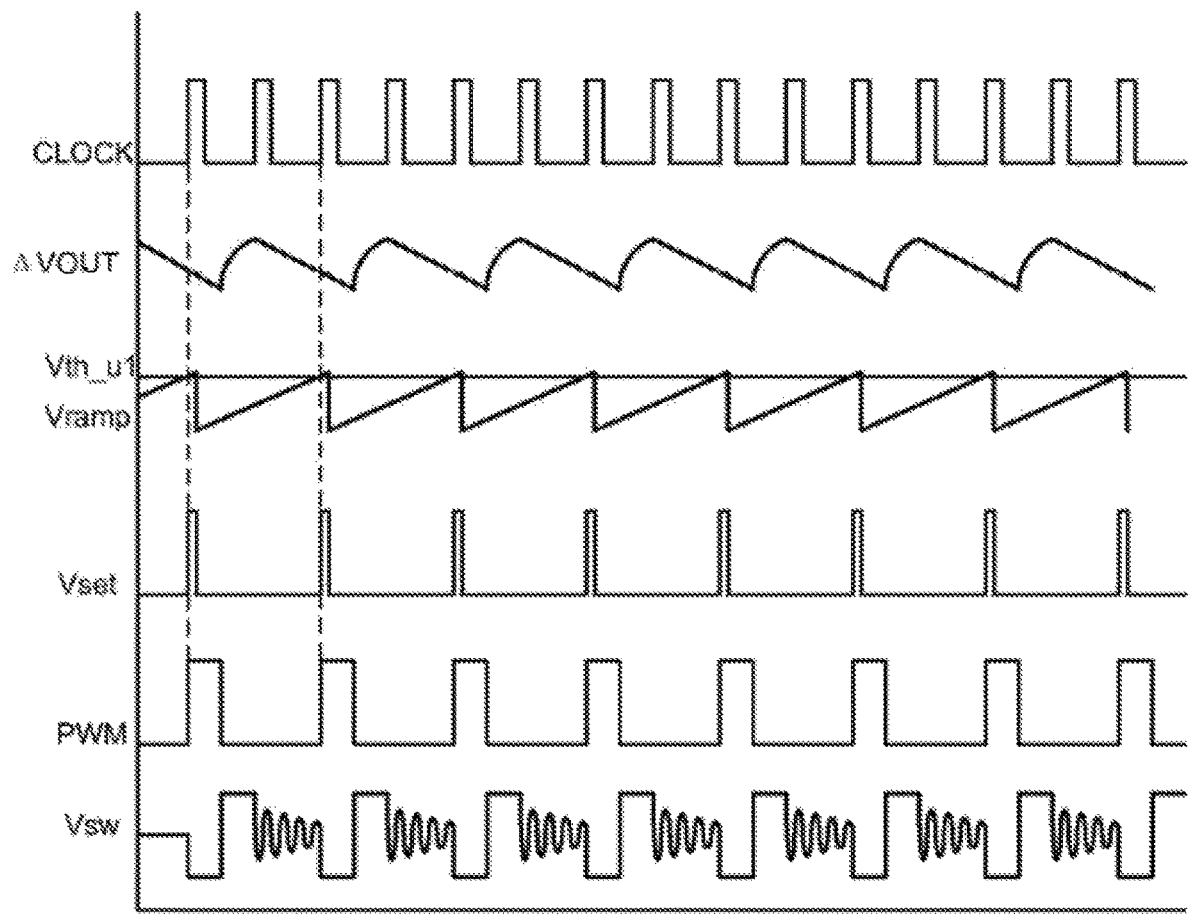
FIG. 5 is a waveform diagram showing example operation of the circuit of FIG. 4, in accordance with embodiments of the present invention.

Referring now to FIG. 5, shown is a waveform diagram of example operation of the circuit of FIG. 4, in accordance with embodiments of the present invention. For example, signal Vsw may represent the voltage of the power switch at the non-ground terminal of the power stage circuit, and signal ΔVOUT may represent the fluctuation of the output voltage. In this example, compensation signal Vcom can be relatively close to reference voltage Vc_low (e.g., a predetermined threshold) at the light load state, and the voltage difference between compensation signal Vcom and reference voltage Vc_low and the transconductance amplification coefficient of transconductance amplifier Gm2 can determine the charging current of capacitor C1. The value of the charging current may determines the rising slope of ramp signal Vramp. When ramp signal Vramp is higher than predetermined voltage threshold value Vth_u1, the voltage of ramp signal Vramp may be treated as a high level for logic circuit U1, and when a pulse of the system clock signal is high level, the output signal of logic circuit U1 is a high level. After being delayed by delay circuit DLY, voltage Vset can control switch S1 to be turned on, and then capacitor C1 may be discharged and ramp signal Vramp rapidly drops to the ground level.

Since the rising speed of ramp signal Vramp can vary with compensation signal Vcom, and the value of compensation signal Vcom is smaller at the light load state, the value of ramp signal Vramp may slowly increase and become greater than voltage threshold value Vth_u1 after a plurality of clock cycles. In this way, the clock dividing frequency circuit can generate pulses of the dividing frequency clock signal after a plurality of system clock cycles, and the generation timing of the dividing frequency clock signal may be synchronized with the system clock signal. The operating frequency of the power transistors of the power stage circuit may decrease and become synchronized with the system clock signal.

Therefore, the operating frequency of the power transistors may be automatically decreased at the light load state, and the dividing frequency operation may be realized, in order to reduce the output voltage ripple at a light load state and to improve response of the load regulation rate at the light load state. Those skilled in the art will recognize that, although the types of switching converter described herein is primarily the boost type topology, a clock dividing frequency circuit in particular embodiments can also be applied to any type of switching type converter (e.g., a buck topology, buck-boost topology, charge pump topology, etc.), in order to reduce the output voltage ripple, and improve response of the load regulation rate at light load state.

Figure 6:
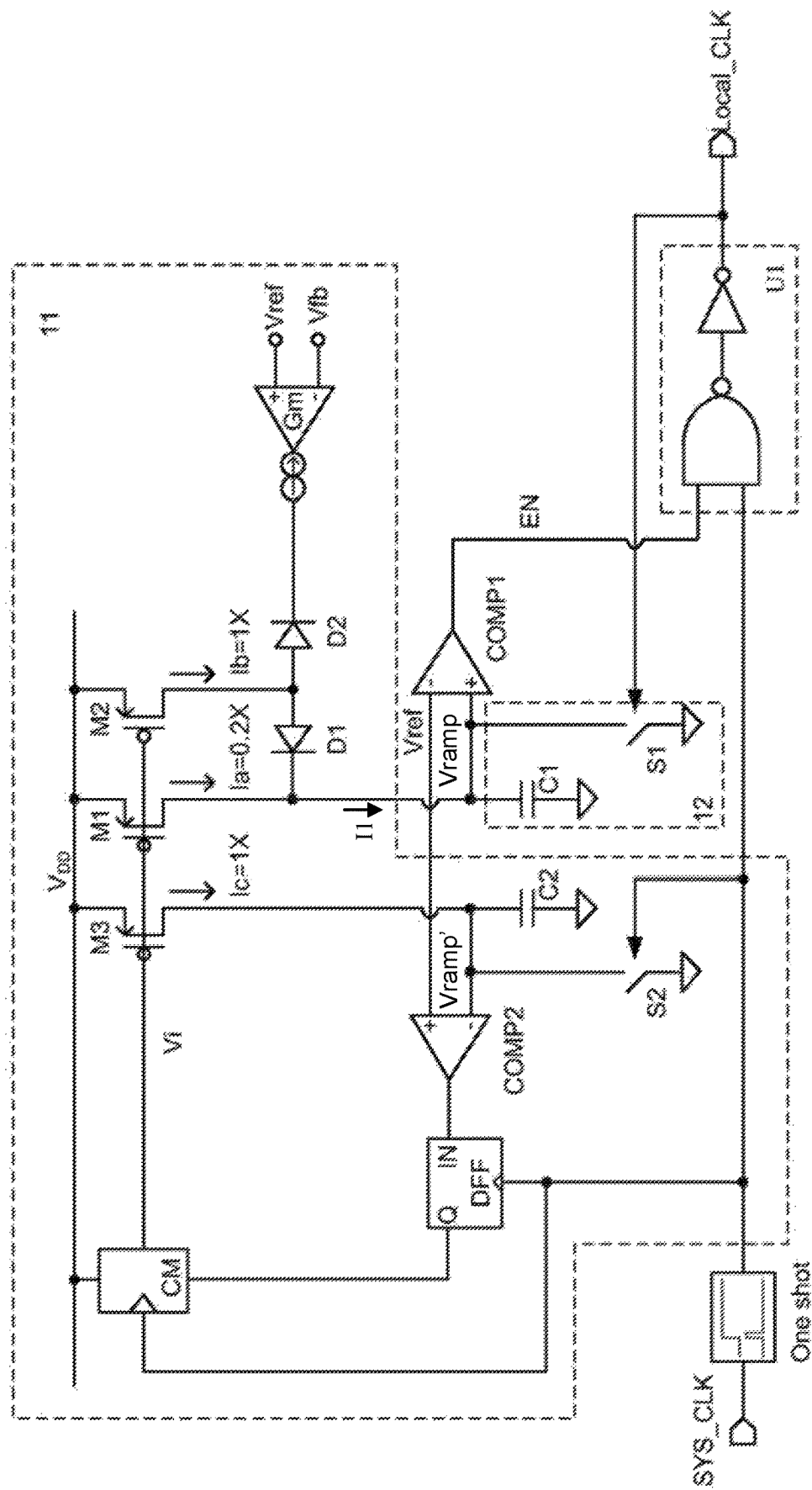
FIG. 6 is a schematic block diagram of an example clock dividing frequency circuit, in accordance with embodiments of the present invention.

Referring now to FIG. 6, shown is a schematic block diagram of an example clock dividing frequency circuit, in accordance with embodiments of the present invention. In this particular example, clock dividing frequency circuit 1 can include controlled current source 11, ramp signal generating circuit 12, and a dividing frequency pulse generating circuit. For example, controlled current source 11 can generate driving current I1 that varies with the dividing frequency control signal. Ramp signal generating circuit 12 can generate ramp signal Vramp, a slope of which can vary along with driving current I1 The dividing frequency pulse generating circuit can generate the dividing frequency clock signal by a dividing frequency operation according to the ramp signal and the system clock.

In particular embodiments, the dividing frequency control signal can be configured as output feedback voltage Vfb or the output current of the power converter. Ramp signal generating circuit 12 can include capacitor C1 and switch S1 coupled in parallel. For example, capacitor C1 and switch S1 can be coupled in parallel between the output terminal of controlled current source 11 and ground. The terminal that is not grounded of capacitance C1 can generate ramp signal Vramp. In this example of ramp signal generation circuit 12, controlled current source 11 can generate driving current I1 to charge capacitor C1 and control the slope of ramp signal Vramp when switch S1 is turned off. When switch S1 is turned on, controlled current source 11 can generate driving current I1 that flows to the ground terminal through switch S1, and capacitor C1 can be discharged by the diving current such that the capacitor voltage rapidly drops to the ground level.

In particular embodiments, controlled current source 11 can include a reference current generating circuit, reference current source M1, and a current adjusting circuit. For example, the reference current generating circuit can generate reference current control signal Vi. Reference current control signal Vi can be provided to the control terminal of reference current source M1 for generating reference current Ia to drive ramp signal generation circuit 12 for generating a ramp signal having a predetermined slope. For example, reference current source M1 can be a metal oxide field-effect transistor (MOSFET) coupled between the power supply terminal VDD and the output terminal, and the current flowing through the MOSFET can be adjusted by adjusting the gate voltage of the MOSFET to provide the desired current generated by the current source.

In particular embodiments, reference current Ia can be configured to make the ramp signal increase to reference voltage Vref after N system clock cycles, where N is greater than 1. For example, Ia=0.2X, where X is the current that makes a voltage across capacitor C1 rise to reference voltage Vref in one system clock cycle, whereby reference current Ia is used to charge capacitance C1 and make the capacitance C1 voltage rise to the level of reference voltage Vref within five system clock cycles. The current regulating circuit can be coupled to reference current source M1 for adjusting the current that flows to ramp signal generating circuit 12 in accordance with the dividing frequency control signal.

The current reference generation circuit can include reference current source M3, a ramp signal generation circuit, and a control signal adjustment circuit. For example, reference current source M3 can generate a driving current according to the reference current control signal. The ramp signal generating circuit driven by the driving current can generate ramp signal Vramp'. The control signal adjusting circuit can adjust reference current control signal Vi in accordance with ramp signal Vramp' and reference voltage Vref, such that the ramp signal has a predetermined slope. That is, reference current source M3, the ramp signal generation circuit, and the control signal conditioning circuit may form a closed loop control circuit such that reference current control signal Vi can make capacitor C2 voltage in the ramp signal generating circuit rise to the level of reference voltage Vref within a predetermined time (e.g., one system clock cycle).

The ramp signal generating circuit in the current reference generating circuit can include capacitor C2 and switch S2 coupled in parallel between the output terminal of reference current source M3 and the ground terminal. Switch S2 can be controlled by the pulses of the system clock signal in synchronization with the system clock signal. The pulses of the system clock signal can be generated by a single trigged circuit "One shot" that receives the system clock signal shown. When capacitors C1 and C2 are the same sizes, if the voltage of capacitor C2 charged by current X rises to reference voltage Vref in one system clock cycle, the same can occur as to the voltage of capacitor C1. In this way, the desired reference current control signal can be obtained.

The control signal adjusting circuit can include comparator COMP2, D flip-flop DFF, and current regulator CM. for example, comparator COMP2 can compare ramp signal Vramp' against reference voltage Vref, and may generate a state indicating signal. The state indication signal can indicate whether the ramp signal Vramp' is greater than reference voltage Vref. D flip-flop DFF can buffer and generate the adjustment indication signal according to the pulses of the system clock signal when switch S2 is turned on (e.g., near the rising edge of the system clock signal). Thus, D flip-flop DFF can obtain ramp signal Vramp' by buffering at the end of a system clock cycle. That is, at the end of a system clock cycle, depending on whether the ramp signal has risen above reference voltage Vref, the adjustment indication signal may be generated accordingly.

If ramp signal Vramp' does not rise to the level of reference voltage Vref in one system clock cycle, the adjustment indication signal may be high. If ramp signal Vramp' rises above reference voltage Vref in one system clock cycle, the adjustment indicator signal can be low. Current regulator CM can adjust reference current control signal Vi in accordance with the adjustment instruction signal. Current Ic generated by reference current source M3 can increase when the adjustment instruction signal is high, and current Ic may accordingly decrease when the adjustment instruction signal is low. Thus, the reference current control signal can precisely control current Ic to equal X by the closed-loop control circuit, where X is the current across capacitor C1 such that the capacitor voltage rise to reference voltage Vref in one system clock cycle.

For example, current adjusting circuit 11b can include reference current source M2, diodes D1 and D2, and transconductance amplifier Gm. For example, reference current source M2 can generate reference current Ib according to reference current control signal Vi. Reference current Ib can be proportional to reference current Ia (e.g., both reference currents Ia and Ib are proportional to X). For example, reference current Ib=1X. that is, the current intensity can make the voltage of capacitor C1 rise to reference voltage Vref in one system clock cycle.

Diode D1 can connect between reference current source M2 and reference current source M1. The anode of diode D1 can connect to the output terminal of reference current source M2, and the cathode of diode D1 can connect to the output terminal of reference current source M1. Diode D2 can connect between the output terminal of transconductance amplifier Gm and the output terminal of reference current source M2. The anode of diode D2 can connect to the output terminal of reference current source M2, and the cathode of diode D2 can connect to the output of transconductance amplifier Gm. Thus, the current generated by reference current source M2 can flow to ramp signal generation circuit 12 through diode D1, or may flow to transconductance amplifier Gm through diode D2.

The current intensity flowing from reference current source M2 to transconductance amplifier Gm can be controlled by the input signals of transconductance amplifier Gm. The current generated by reference current source M1 and the current generated by transconductance amplifier Gm may not be interchanged due to the unidirectional conduction characteristics of diodes D1 and D2. Thus, current regulating circuit 11b may superimpose a current of Ib−Igm on the current generated by reference current source M1, such that driving current I1 can be adjusted at an amplitude of 0 to Ib. In addition, current Igm generated by transconductance amplifier Gm may be proportional to voltage difference Vref-Vfb at its input. As a result, driving current I1 can vary with dividing frequency control signal Vfb in this example.

Those skilled in the art will recognize that the capacitances of capacitors C1 and C2 may be proportional to each other, and the voltage in the current reference generating circuit can also be proportional to reference voltage Vref, in an alternative implementation. It should also be noted that one input terminal of the transconductance amplifier can receive reference voltage Vref, and the other input terminal can receive feedback voltage Vfb. Reference voltage Vref may also be the same as the reference voltage related in the current reference generating circuit, and both can characterize the voltage parameter of the desired output of the power converter.

Driving current I1 flowing to ramp signal generating circuit 12 can be varied between Ia and Ia+Ib. If reference current Ia=0.2X generated by reference current source M1, and reference current Ib=1X generated by reference current source M2, are used as the parameters shown in FIG. 6, the time of ramp signal Vramp rising to reference voltage Vref can vary continuously between one and five times the system clock period according to feedback voltage Vfb. For example, reference current sources M1-M3 can each include a MOSFET having a different area to form a current mirror such that that a different, proportional current can be accurately generated under the same reference current control signal.

For example, the dividing frequency pulse generating circuit can include comparator COMP1 and AND logic circuit U1. Comparator COMP1 can compare ramp signal Vramp against reference voltage Vref, and may generate enable pulse signal EN. AND logic circuit U1 can generate the clock signal dividing frequency according to the pulses of the system clock when the enable pulse signal is at a predetermined level. For example, one input terminal of AND logic circuit U1 can receive enable pulse signal EN, and the other input terminal can receive the pulses of the system clock. The pulses of the system clock signal can be high level pulses generated by the single trigged circuit One shot when the system clock period is switching.

Enable pulse signal EN can be a high level when ramp signal Vramp rises above reference signal Vref, and only when the pulses of the system clock signal are high, the AND logic circuit U1 can activate the dividing frequency clock signal. Thus, while keeping synchronization with the system clock, the clock signal can be divided according to the rising time of ramp signal Vramp. For example, when the difference between feedback voltage Vfb and reference voltage Vref is relatively large, all the current generated by reference current source M2 may flow to transconductance amplifier Gm, and driving current I1=Ia=0.2X. Thus for example, ramp signal Vramp can rise to reference voltage Vref within five system clock cycles. After ramp signal Vramp rises to reference voltage Vref, AND logic circuit U1 can generate the dividing frequency clock signal in accordance with the pulses of the system clock signal. Otherwise, AND logic circuit U1 can remain at a low level. Thereby, the pulses of the system clock signal may be generated every 5 clock cycles, in order to realize the dividing frequency of the system clock signal.

Reference current sources M1-M3 may respectively charge capacitors C1 and C2 having the same capacitance values (e.g., having the same size in the integrated circuit). Capacitor C1 can be periodically discharged at the beginning of the cycle by switch S1 controlled by clock signal Local_CLK generated by the dividing frequency operation, and capacitor C2 can be discharged at the beginning of the cycle by switch S2 controlled by system clock signal SYS_CLK. Comparator COMP2, D flip-flop DFF, and current regulator CM may form a follower loop circuit such that current Ic charges capacitor C2 and makes the capacitor voltage accurately rise to reference voltage Vref when the system clock period alternates. Comparator COMP1 and transconductance amplifier Gm may form the core of the clock dividing frequency circuit of the analog circuitry.

Figure 7:
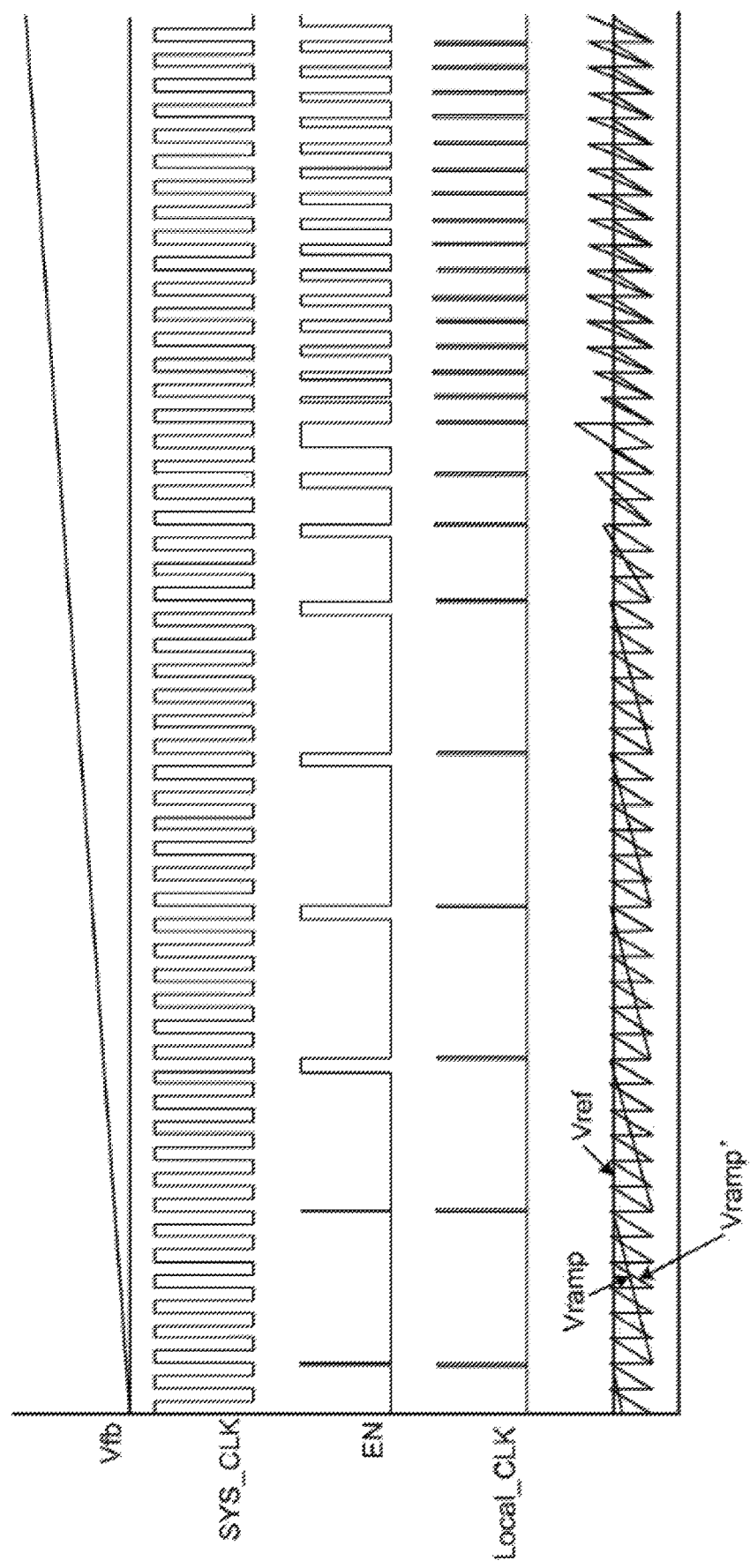
FIG. 7 is a waveform diagram showing example operation of the circuit of FIG. 6, in accordance with embodiments of the present invention.

Referring now to FIG. 7, shown is a waveform diagram showing example operation of the circuit of FIG. 6, in accordance with embodiments of the present invention. In this example, when feedback voltage Vfb is 0 volts (e.g., equal to ground), such as when the output terminal is short-circuited, transconductance amplifier Gm can draw current from reference current source M2. The current charged to capacitor C1 may only be ⅕ of the current charged to capacitor C2, such that the charging time of capacitor C1 charged to reference voltage Vref is 5 times the charging time of capacitor C2 charged to reference voltage Vref. When capacitor C1 voltage is charged to the level of reference voltage Vref, the enable pulse signal generated by comparator COMP1 can be low so as to turn off AND logic circuit U1, whereby the pulses of the system clock signal may not be provided at the output to effectively achieve the dividing frequency.

With feedback voltage Vfb rising slowly, the current drawn by transconductance amplifier Gm may be reduced, such that more current from reference current source M2 flows to capacitor C1 in order to increase its charging rate and whereby ramp signal Vramp rises more quickly. When feedback voltage Vfb rises to the level of reference voltage Vref, transconductance amplifier Gm may no longer draw current from reference current source M2, and the driving current charged to capacitor C1 is Ia+Ib. This makes the charging speed of capacitor C1 to be about 20% higher than that of capacitor C2, and enable pulse signal EN generated by comparator COMP1 may go high earlier than the status indicator signal generated by comparator COMP2, so as to ensure that the AND logic circuit can be enabled prior to the arrival of pulses of the system clock.

In this way, the clock dividing frequency circuit can control the slope of the ramp signal by a controlled current source, and may generate the dividing frequency clock signal generated by dividing frequency operation according to the ramp signal and the system clock. Thus, analog circuitry can be utilized in order to divide the frequency smoothly and proportionally according to the voltage difference.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A clock dividing frequency circuit, comprising:
   a) a controlled current source configured to generate a driving current that varies with a dividing frequency control signal;
   b) a ramp signal generating circuit configured to generate a ramp signal having a slope that varies according to said driving current, wherein said ramp signal is reset to a ground at zero volts according to pulses of a dividing frequency clock signal, wherein a frequency of said dividing frequency clock signal varies with said driving current; and
   c) a dividing frequency pulse generating circuit configured to generate said dividing frequency clock signal by a dividing frequency operation according to said ramp signal and a system clock signal, wherein a frequency of said system clock signal is N times a frequency of said dividing frequency clock signal, and N is an integer that is greater than or equal to 2.

2. The clock dividing frequency circuit of claim 1, wherein pulses of said system clock signal are configured as said dividing frequency clock signal when said ramp signal is higher than a predetermined threshold value.

3. The clock dividing frequency circuit of claim 1, wherein said ramp signal generating circuit comprises:
   a) a first capacitor configured to be charged by said driving current such that a voltage rise across said first capacitor rises to a reference voltage within a time interval that corresponds to said dividing frequency control signal; and
   b) a first switch coupled in parallel with said first capacitor, wherein said first switch is controlled according to said dividing frequency clock signal.

4. The clock dividing frequency circuit of claim 3, wherein:
   a) said dividing frequency pulse generating circuit comprises a logic circuit configured to receive said ramp signal and said system clock signal, and to generate said dividing frequency clock signal; and
   b) said reference voltage is configured as an input of said logic circuit.

5. The clock dividing frequency circuit of claim 3, wherein said controlled current source comprises a transconductance amplifier configured to generate said driving current in accordance with said reference voltage and said dividing frequency control signal.

6. The clock dividing frequency circuit of claim 5, wherein said dividing frequency control signal is configured as a compensation signal of a control loop circuit of a switching converter.

7. The clock dividing frequency circuit of claim 3, wherein said dividing frequency pulse generating circuit comprises:
   a) a comparator configured to compare said ramp signal against said reference voltage, and to generate an enable pulse signal; and
   b) an AND logic circuit configured to generate said dividing frequency clock signal according to pulses of said system clock signal when a value of said enable pulse signal is at a predetermined level.

8. The clock dividing frequency circuit of claim 7, wherein said controlled current source comprises:
   a) a reference current generating circuit configured to generate a reference current control signal;
   b) a first reference current source configured to generate a first reference current according to said reference current control signal, wherein said first reference current is configured to control said ramp signal generating circuit to generate said ramp signal having a predetermined slope; and
   c) a current adjusting circuit coupled to said first reference current source, and being configured to adjust a current that flows to said ramp signal generation circuit according to said dividing frequency control signal.

9. The clock dividing frequency circuit of claim 8, wherein said first reference current is configured to make said ramp signal increase to said reference voltage within N system clock cycles, and wherein N is greater than one.

10. The clock dividing frequency circuit of claim 8, wherein said reference current generating circuit comprises:
    a) a second reference current source configured to generate a second reference current according to said reference current control signal, wherein said ramp signal generating circuit is configured to generate said ramp signal in accordance with said second reference current; and
    b) a control signal adjusting circuit configured to adjust said reference current control signal according to said ramp signal and said reference voltage such that said ramp signal has a predetermined slope.

11. The clock dividing frequency circuit of claim 10, wherein said control signal adjusting circuit is configured to adjust said reference current control signal to make said ramp signal increase to said reference voltage in one clock cycle.

12. The clock dividing frequency circuit of claim 11, wherein said control signal adjusting circuit is configured to adjust said reference current control signal according to said ramp signal and said reference voltage when said system clock cycle switches.

13. The clock dividing frequency circuit of claim 10, wherein said ramp signal generating circuit comprises:
    a) a second capacitor configured to be charged by said driving current; and
    b) a second switch coupled in parallel with said second capacitor, wherein said second switch is configured to be controlled according to pulses of said system clock signal.

14. The clock dividing frequency circuit of claim 13, wherein a capacitance value of said first capacitor is proportional to a capacitance value of said second capacitor.

15. The clock dividing frequency circuit of claim 10, wherein said control signal adjusting circuit comprises:
    a) a comparator configured to compare said ramp signal against said reference voltage, and to generate a state indication signal;
    b) a D flip-flop configured to record said state indication signal when said system clock cycle switches, and to generate an adjustment indication signal; and
    c) a current regulator configured to adjust said reference current control signal according to said adjustment indication signal.

16. The clock dividing frequency circuit of claim 8, wherein said current adjustment circuit comprises:
  a) a third reference current source configured to generate a third reference current proportional to said first reference current according to said reference current control signal;
  b) a first diode coupled between said third reference current source and said first reference current source;
  c) a transconductance amplifier configured to receive a dividing frequency reference voltage and said dividing frequency control signal; and
  d) a second diode coupled between an output of said transconductance amplifier and an output of said third reference current source.

17. The clock dividing frequency circuit of claim 16, wherein said dividing frequency control signal is configured as a feedback signal of a control loop circuit of a switching converter.

18. A control circuit, comprising the clock dividing frequency of claim 1, wherein:
  a) a compensation signal representing error information of an output signal of a switching converter is configured as said dividing frequency control signal to regulate said driving current of said controlled current source; and
  b) said dividing frequency clock signal is configured to control an operation f a transistor of said switching converter.

19. A power management integrated circuit, comprising the clock dividing frequency circuit of claim 1, and being configured to control a plurality of switching converters, wherein:
  a) said clock dividing frequency circuit s configured to generate at least ogre dividing frequency clock signal corresponding to said plurality of switching converters, in order to achieve dividing frequency control; and
  b) said system clock signal and said at least one dividing frequency clock signal are synchronized.

20. The clock dividing frequency circuit of claim 1, wherein:
  a) said ramp signal generating circuit comprises a first switch and a first capacitor coupled in parallel between the output of said controlled current source and said ground; and
  b) said ramp signal is reset to said ground at zero volts by said first switch.

* * * * *